(12) United States Patent
Yu et al.

(10) Patent No.: US 7,239,186 B2
(45) Date of Patent: Jul. 3, 2007

(54) SYSTEM AND METHOD FOR POWER-ON CONTROL OF INPUT/OUTPUT DRIVERS

(75) Inventors: Ta-Lee Yu, Shanghai (CN); Lei Wang, Shanghai (CN); Li An Da, Bao Li Town (CN)

(73) Assignee: Semiconductor Manufacturing International (Shanghai) Corporation, Shanghai (CN)

( * ) Notice: Subject to any disclaimer, the term of this patent is extended or adjusted under 35 U.S.C. 154(b) by 0 days.

(21) Appl. No.: 11/262,505

(22) Filed: Oct. 28, 2005

(65) Prior Publication Data

US 2007/0080721 A1 Apr. 12, 2007

(30) Foreign Application Priority Data

Sep. 27, 2005 (CN) .................. 2005 1 0030369

(51) Int. Cl.
*H03B 1/00* (2006.01)
*H03K 3/00* (2006.01)

(52) U.S. Cl. .................. 327/112; 326/80; 326/82

(58) Field of Classification Search ........ 327/108–112, 327/170, 379, 389, 391, 333; 326/26, 27, 326/80–83, 87, 89–91
See application file for complete search history.

(56) References Cited

U.S. PATENT DOCUMENTS

| 6,803,789 B1 * | 10/2004 | Yu et al. ................. 326/81 |
| 2002/0130683 A1 * | 9/2002 | Nishio et al. ............. 326/83 |
| 2006/0170454 A1 * | 8/2006 | Choi ....................... 326/82 |

\* cited by examiner

*Primary Examiner*—Timothy P. Callahan
*Assistant Examiner*—Diana Cheng
(74) *Attorney, Agent, or Firm*—Townsend and Townsend and Crew LLP

(57) ABSTRACT

A system and method for controlling an input/output driver. The system includes a control system configured to receive a first supply voltage and a second supply voltage and generate a control signal, and a first transistor including a first gate, a first terminal, and a second terminal. The first gate is configured to receive the control signal, and the first terminal is configured to receive the first supply voltage. Additionally, the system includes a second transistor including a second gate, a third terminal, and a fourth terminal, and the second gate is coupled to the second terminal. Moreover, the system includes a third transistor including a third gate, a fifth terminal, and a sixth terminal, and the third gate is configured to receive the control signal. Also, the system includes an input/output pad coupled to the fourth terminal and the fifth terminal.

20 Claims, 5 Drawing Sheets

SYSTEM AND METHOD FOR POWER-ON CONTROL OF INPUT/OUTPUT DRIVERS

CROSS-REFERENCES TO RELATED APPLICATIONS

This application claims priority to Chinese Patent Application No. 200510030369.8, filed Sep. 27, 2005, commonly assigned, incorporated by reference herein for all purposes.

STATEMENT AS TO RIGHTS TO INVENTIONS MADE UNDER FEDERALLY SPONSORED RESEARCH OR DEVELOPMENT

NOT APPLICABLE

REFERENCE TO A "SEQUENCE LISTING," A TABLE, OR A COMPUTER PROGRAM LISTING APPENDIX SUBMITTED ON A COMPACT DISK.

NOT APPLICABLE

BACKGROUND OF THE INVENTION

The present invention is directed to integrated circuits. More particularly, the invention provides a system and method for power-on control. Merely by way of example, the invention has been applied to input/output drivers. But it would be recognized that the invention has a much broader range of applicability.

Integrated circuits or "ICs" have evolved from a handful of interconnected devices fabricated on a single chip of silicon to millions of devices. Current ICs provide performance and complexity far beyond what was originally imagined. In order to achieve improvements in complexity and circuit density (i.e., the number of devices capable of being packed onto a given chip area), the size of the smallest device feature, also known as the device "geometry", has become smaller with each generation of ICs. Semiconductor devices are now being fabricated with features less than a quarter of a micron across.

Increasing circuit density has not only improved the complexity and performance of ICs but has also provided lower cost parts to the consumer. An IC fabrication facility can cost hundreds of millions, or even billions, of dollars. Each fabrication facility will have a certain throughput of wafers, and each wafer will have a certain number of ICs on it. Therefore, by making the individual devices of an IC smaller, more devices may be fabricated on each wafer, thus in creasing the output of the fabrication facility. Making devices smaller is very challenging, as a given process, device layout, and/or system design often work down to only a certain feature size. An example of such a limit is the performance of an input/output driver. If the input/output driver operates in an uncertain state, the input/output crowbar current may become higher, and the input/output bus can even become congested.

From the above, it is seen that an improved technique for input/output driver is desired.

BRIEF SUMMARY OF THE INVENTION

The present invention is directed to integrated circuits. More particularly, the invention provides a system and method for power-on control. Merely by way of example, the invention has been applied to input/output drivers. But it would be recognized that the invention has a much broader range of applicability.

In a specific embodiment, the invention provides a system for controlling an input/output driver. The system includes a control system configured to receive a first supply voltage and a second supply voltage and generate a control signal, and a first transistor including a first gate, a first terminal, and a second terminal. The first gate is configured to receive the control signal, and the first terminal is configured to receive the first supply voltage. Additionally, the system includes a second transistor including a second gate, a third terminal, and a fourth terminal, and the second gate is coupled to the second terminal. Moreover, the system includes a third transistor including a third gate, a fifth terminal, and a sixth terminal, and the third gate is configured to receive the control signal. Also, the system includes an input/output pad coupled to the fourth terminal and the fifth terminal. The first supply voltage can be equal to at least a first voltage level or a second voltage level, the second voltage level being higher than the first voltage level, and the second supply voltage can be equal to at least a third voltage level or a fourth voltage level, the fourth voltage level being higher than the third voltage level. The control signal is indicative of a first control state if the first supply voltage is equal to the second voltage level and the second supply voltage is equal to the third voltage level, and the control signal is indicative of a second control state if the first supply voltage is equal to the second voltage level and the second supply voltage is equal to the fourth voltage level. If the control signal is indicative of the first control state, the second transistor and the third transistor are turned off.

In another embodiment, a system for controlling an input/output driver includes a control system configured to receive a first supply voltage and a second supply voltage and generate a control signal, and a first transistor including a first gate, a first terminal, and a second terminal. The first gate is configured to receive the control signal, and the first terminal is configured to receive the first supply voltage. Additionally, the system includes a second transistor including a second gate, a third terminal, and a fourth terminal, and the second gate is coupled to the second terminal. Moreover, the system includes a third transistor including a third gate, a fifth terminal, and a sixth terminal, and the third gate is configured to receive the control signal. Also, the system includes an input/output pad coupled to the fourth terminal and the fifth terminal. The control system includes a fourth transistor including a fourth gate, and the fourth gate is configured to receive the second supply voltage. Additionally, the control system includes an inverter configured to receive the second supply voltage and generate a voltage signal, and a fifth transistor including a fifth gate and a seventh terminal. The fifth gate is configured to receive the voltage signal. Moreover, the control system includes a sixth transistor. The sixth transistor includes a sixth gate, is coupled to the fourth transistor and the fifth transistor, and is configured to receive the first supply voltage. Also, the control system includes a seventh transistor. The seventh transistor includes a seventh gate and an eighth terminal, is coupled to the fourth transistor and the fifth transistor, and is configured to receive the first supply voltage.

In yet another embodiment, a method for controlling an input/output driver includes receiving a first supply voltage, receiving a second supply voltage, processing information associated with the first supply voltage and the second supply voltage, and generating a control signal based on at least information associated with the first supply voltage and the second supply voltage. Additionally, the method includes processing information associated with the control signal, turning on or off a first transistor based on at least information associated with the control signal, and turning on or off a second transistor based on at least information associated with the control signal. The first transistor and the second transistor are coupled to an input/output pad. The first supply voltage can be equal to at least a first voltage level or a second voltage level, the second voltage level being higher than the first voltage level, and the second supply voltage can be equal to at least a third voltage level or a fourth voltage level, the fourth voltage level being higher than the third voltage level. The control signal is indicative of a first control state if the first supply voltage is equal to the second voltage level and the second supply voltage is equal to the third voltage level, and the control signal is indicative of a second control state if-the first supply voltage is equal to the second voltage level and the second supply voltage is equal to the fourth voltage level. If the control signal is indicative of the first control state, turning off the first transistor and turning off the second transistor.

Many benefits are achieved by way of the present invention over conventional techniques. Some embodiments of the present invention provide a power-on control signal, which can make the input/output pad at a high impedance state if the input/output voltage supply is powered on but the core voltage supply is not yet powered on. Certain embodiments of the present invention provide a power-on control signal, which allows the input/output pad to work properly if both the input/output voltage supply and the core voltage supply are powered on. For example, the input/output pad is at a logic high state, a logic low state, or a high impedance state. Some embodiments of the present invention can reduce or eliminate high input/output crowbar current even if the input/output voltage supply is powered on but the core voltage supply is not yet powered on. Certain embodiments of the present invention can reduce or eliminate bus congestion even if the input/output voltage supply is powered on but the core voltage supply is not yet powered on. Depending upon the embodiment, one or more of these benefits may be achieved. These and other benefits will be described in more throughout the present specification and more particularly below.

Various additional objects, features and advantages of the present invention can be more fully appreciated with reference to the detailed description and accompanying drawings that follow.

DETAILED DESCRIPTION OF THE INVENTION

The present invention is directed to integrated circuits. More particularly, the invention provides a system and method for power-on control. Merely by way of example, the invention has been applied to input/output drivers. But it would be recognized that the invention has a much broader range of applicability.

Figure 1:
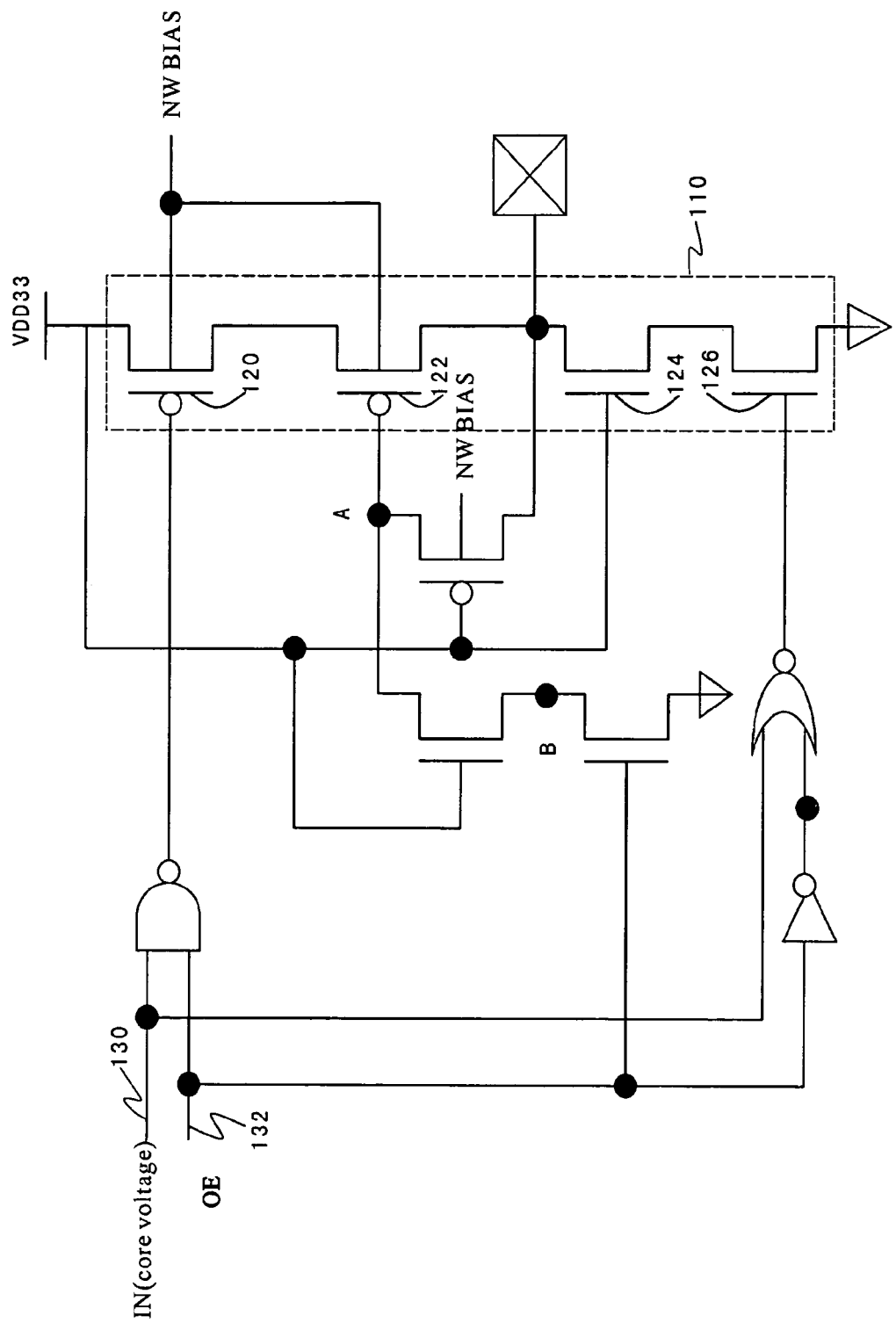
FIG. 1 is a simplified conventional system for input/output driver.

FIG. 1 is a simplified conventional system for input/output driver. An input/output driver 110 includes transistors 120, 122, 124, and 126, and is controlled by an input voltage 130 and an output enabling signal 132. For example, the input voltage 130 is a core supply voltage. When the core supply voltage is not yet powered up but an input/output supply voltage is already powered up, the input/output driver 110 operates in an uncertain state. For example, if the transistors 120, 122, 124, and 126 all are turned on, the input/output crowbar current becomes higher. Additionally, the input/output bus can even become congested.

Figure 2A:
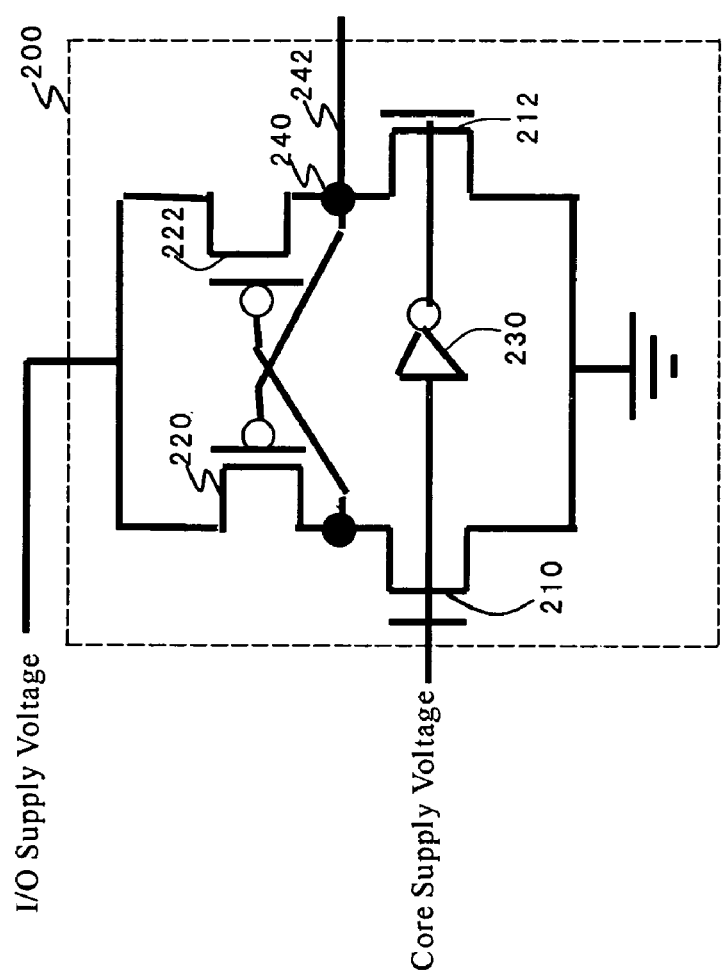
FIGS. 2(A) and (B) show simplified power-on control system and input/output system according to an embodiment of the present invention.

FIGS. 2(A) and (B) show simplified power-on control system and input/output system according to an embodiment of the present invention. These diagrams are merely examples, which should not unduly limit the scope of the claims. One of ordinary skill in the art would recognize many variations, alternatives, and modifications. A power-on control system 200 includes the following components:
1. transistors 210 and 212;
2. transistors 220 and 222;
3. an inverter 230.

Although the above has been shown using a selected group of components for the control system 200, there can be many alternatives, modifications, and variations. For example, some of the components may be expanded and/or combined. Other components may be inserted to those noted above. Depending upon the embodiment, the arrangement of components may be interchanged with others replaced. For example, the system 200 provides a power-on control signal to an input/output system 250. In another example, the system 200 is part of an input/output power supply cell. Further details of these components are found throughout the present specification and more particularly below.

For example, the transistors 220 and 222 are PMOS transistors. The sources of the transistors 220 and 222 each are biased to an input/output supply voltage. In another example, the transistors 210 and 212 are NMOS transistors. The gate of the transistor 210 is biased to a core supply voltage. The core supply voltage is also received by the inverter 230. The inverter sends its output to the gate of the transistor 212. The drain of the transistor 210 is connected to the drain of the transistor 220 and the gate of the transistor 222. The drain of the transistor 212 is connected to the drain of the transistor 222 and the gate of the transistor 220. The sources of the transistors 210 and 212 each are biased to the ground voltage. At a node 240, a power-on control signal 242 is provided, for example, to the input/output system 250.

Figure 2B:
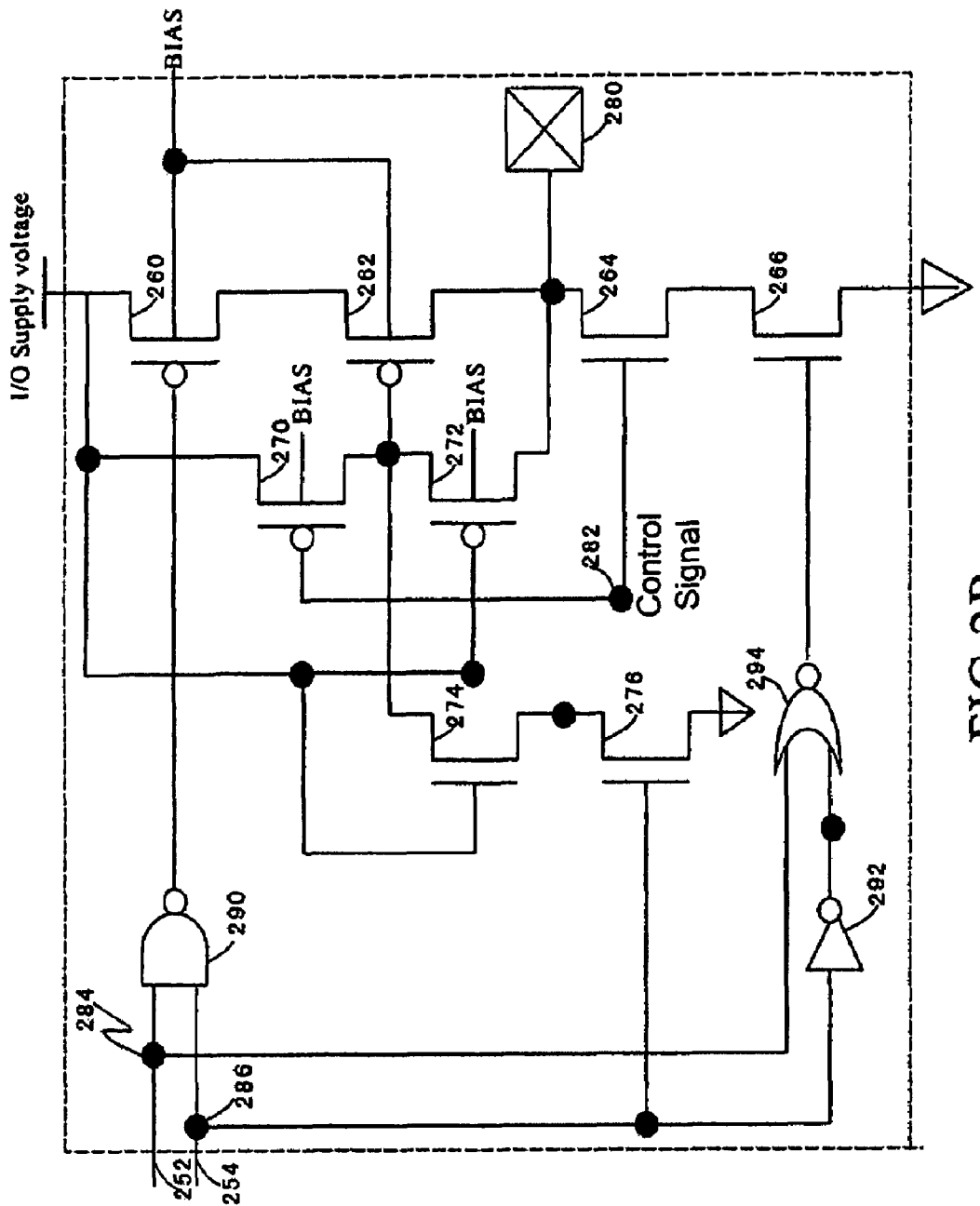

As shown in FIG. 2(B), the input/output system 250 includes the following components:
1. transistors 260, 262, 264, and 266;
2. transistors 270, 272, 274, and 276;
3. an input/output pad 280;
4. a NAND gate 290;
5. an inverter 292;
6. a NOR gate 294.

Although the above has been shown using a selected group of components for the input/output system 250, there can be many alternatives, modifications, and variations. For example, some of the components may be expanded and/or combined. Other components may be inserted to those noted above. Depending upon the embodiment, the arrangement of components may be interchanged with others replaced. For example, the input/output system 250 receives a power-on control signal from the power-on control system 200. In another example, the system 250 is part of an input/output cell. Further details of these components are found throughout the present specification and more particularly below.

At a node 282, the input/output system 250 receives the control signal 242. For example, the transistors 260, 262, and 270 are PMOS transistors, and the transistors 264 and 266 are NMOS transistors. In another example, the transistors 260, 262, 264, and 266 are parts of an input/output driver. The gates of the transistors 270 and 264 each receive the control signal 242. The drain of the transistor 270 is directly connected to the gate of the transistor 262. The drains of the transistors 262 and 264 are connected to the input/output pad 280. The sources of the transistors 270 and 260 are biased to the input/output supply voltage, and the sources of the transistors 266 and 276 are biased to the ground voltage.

Additionally, the drain of the transistor 260 is connected to the source of the transistor 262, and the source of the transistor 264 is connected to the drain of the transistor 266. For example, the transistor 272 is a PMOS transistor. In another example, the PMOS transistors 260, 262, 270, and 272 each are fabricated in an n-type well, which is biased to a predetermined voltage. As shown in FIG. 2(B), the input/output system 250 receives a signal 252 at a node 284, and a signal 254 at a node 286. For example, the signal 252 is equal to at least zero volt or the core supply voltage. In another example, the signal 254 is an output enabling signal. Moreover, the gate bias for the transistor 260 is controlled by the NAND gate 290 based on at least the signals 252 and 254. The gate bias for the transistor 266 is controlled by the inverter 292 and the NOR gate 294 based on at the signals 252 and 254.

Figure 3:
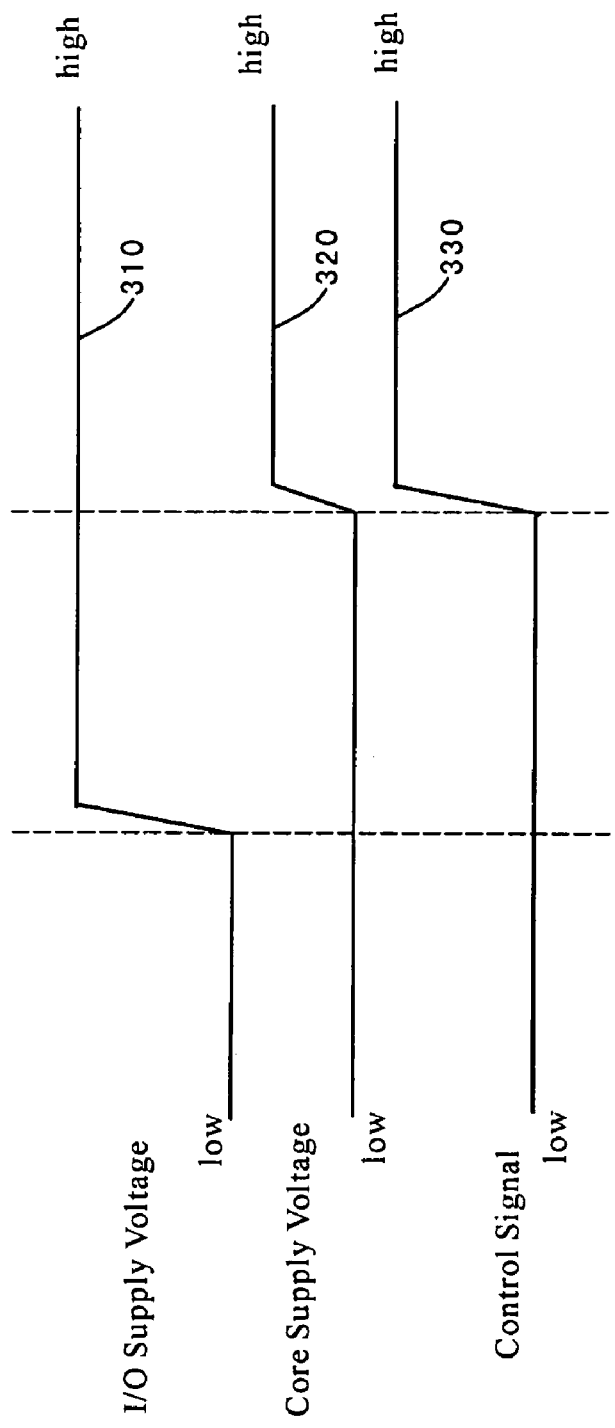
FIG. 3 is a simplified diagram showing operations of the control system and the input/output system according to an embodiment of the present invention.

FIG. 3 is a simplified diagram showing operations of the control system 200 and the input/output system 250 according to an embodiment of the present invention. This diagram is merely an example, which should not unduly limit the scope of the claims. One of ordinary skill in the art would recognize many variations, alternatives, and modifications. In FIG. 3, a curve 310 represents the input/output supply voltage increasing from a low voltage level to a high voltage level at about time $t_1$. A curve 320 represents the core supply voltage increasing from a low voltage level to a high voltage level at about time $t_2$. The time $t_2$ is later than the time $t_1$. For example, the low voltage level for the input/output supply voltage and the low voltage level for the core supply voltage each are equal to 0 volt. In another example, the high voltage level for the input/output supply voltage is equal to 3.3 volts. In yet another example, the high voltage level for the core supply voltage is equal to 1.2 volts.

The input/output supply voltage and the core supply voltage are received by the control system 200. In response, the control system 200 outputs the control signal 242. As shown in FIG. 3, a curve 330 represents the control signal increasing from a low voltage level to a high voltage level at about time $t_2$. The control signal 242 remains at a low voltage level until about the time $t_2$. After the time $t_2$, the control signal increases from the low voltage level to the high voltage level. For example, the low voltage level is equal to 0 volt. In another example, the high voltage level for the control signal 242 is equal to the high voltage level for the input/output voltage supply voltage. In yet another example, the high voltage level for the control signal 242 is equal to 3.3 volts.

Before the time $t_1$, both the input/output supply voltage and the core supply voltage are at their respective low voltage levels. In response, the control signal 242 is also at its low voltage level. Between the time $t_1$ and the time $t_2$, the input/output supply voltage increases from the low voltage level to its high voltage level, but the core supply voltage remains at the low voltage level. In response, the control signal 242 remains at its low voltage level. After the time $t_2$, the core supply voltage increases to its high voltage level while the input/output supply voltage remains at its high voltage level. In response, the control signal 242 increases from the low voltage level to its high voltage level.

In one embodiment, the control signal 242 is received by the gates of the transistors 270 and 264. If the control signal 242 is at its low voltage level and the input/output supply voltage is at its high voltage level, the drain of the transistor 270 provides a high voltage level to the gate of the transistor 262. Between about the time $t_1$ and the time $t_2$, both the transistors 262 and 264 are turned off. The input/output pad 280 is at the high impedance state. If the control signal 242 is at its high voltage level, the transistor 264 is turned on and the transistor 270 is turned off. In response, the gate bias for the transistor 262 is controlled by at least the transistors 272, 274 and 276 based on at least the input/output supply voltage and the signal 254.

Figure 4:
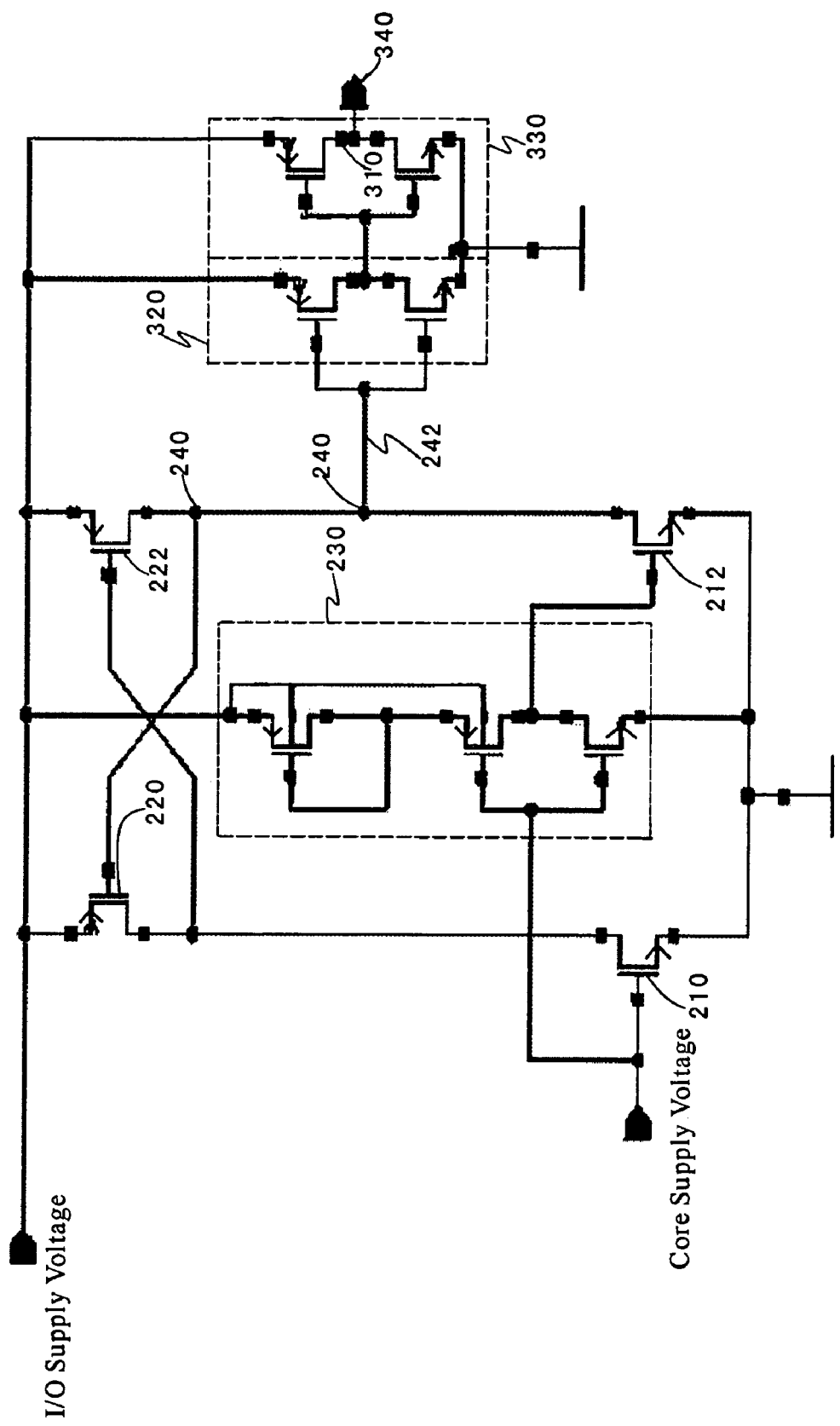
FIG. 4 is the simplified power-on control system according to another embodiment of the present invention.

As discussed above and further emphasized here, FIGS. 2(A), 2(B), and 3 are merely examples, which should not unduly limit the scope of the claims. One of ordinary skill in the art would recognize many variations, alternatives, and modifications. For example, FIG. 4 is the simplified power-on control system 200 according to another embodiment of the present invention. This diagram is merely an example, which should not unduly limit the scope of the claims. One of ordinary skill in the art would recognize many variations, alternatives, and modifications. The power-on control system 200 includes inverters 320 and 330 in addition to the transistors 210, 212, 220 and 222, and the inverter 230. At the node 240, the control signal 242 is output to the inverter 320, which is also coupled to the inverter 330. The inverter 330 generates a power-on control signal 340 at a node 310. For example, the control signal 340 is received by the input/output system 250 at the node 282, and used to bias the gates of the transistors 270 and 264.

In another embodiment, a system for controlling an input/output driver includes a control system configured to receive a first supply voltage and a second supply voltage and generate a control signal, and a first transistor including a first gate, a first terminal, and a second terminal. The first gate is configured to receive the control signal, and the first terminal is configured to receive the first supply voltage. Additionally, the system includes a second transistor including a second gate, a third terminal, and a fourth terminal, and the second gate is coupled to the second terminal. Moreover, the system includes a third transistor including a third gate, a fifth terminal, and a sixth terminal, and the third gate is configured to receive the control signal. Also, the system includes an input/output pad coupled to the fourth terminal and the fifth terminal. The first supply voltage can be equal to at least a first voltage level or a second voltage level, the second voltage level being higher than the first voltage level, and the second supply voltage can be equal to at least a third voltage level or a fourth voltage level, the fourth voltage level being higher than the third voltage level. The control signal is indicative of a first control state if the first supply voltage is equal to the second voltage level and the second supply voltage is equal to the third voltage level, and the control signal is indicative of a second control state if the first supply voltage is equal to the second voltage level and the second supply voltage is equal to the fourth voltage level. If the control signal is indicative of the first control state, the second transistor and the third transistor are turned off. For example, the system is implemented according to the systems 200 and 250.

In yet another embodiment, a system for controlling an input/output driver includes a control system configured to receive a first supply voltage and a second supply voltage and generate a control signal, and a first transistor including a first gate, a first terminal, and a second terminal. The first gate is configured to receive the control signal, and the first terminal is configured to receive the first supply voltage. Additionally, the system includes a second transistor including a second gate, a third terminal, and a fourth terminal, and the second gate is coupled to the second terminal. Moreover, the system includes a third transistor including a third gate, a fifth terminal, and a sixth terminal, and the third gate is configured to receive the control signal. Also, the system includes an input/output pad coupled to the fourth terminal and the fifth terminal. The control system includes a fourth transistor including a fourth gate, and the fourth gate is configured to receive the second supply voltage. Additionally, the control system includes an inverter configured to receive the second supply voltage and generate a voltage signal, and a fifth transistor including a fifth gate and a seventh terminal. The fifth gate is configured to receive the voltage signal. Moreover, the control system includes a sixth transistor. The sixth transistor includes a sixth gate, is coupled to the fourth transistor and the fifth transistor, and is configured to receive the first supply voltage. Also, the control system includes a seventh transistor. The seventh transistor includes a seventh gate and an eighth terminal, is coupled to the fourth transistor and the fifth transistor, and is configured to receive the first supply voltage. For example, the system is implemented according to the systems 200 and 250.

In yet another embodiment, a method for controlling an input/output driver includes receiving a first supply voltage, receiving a second supply voltage, processing information associated with the first supply voltage and the second supply voltage, and generating a control signal based on at least information associated with the first supply voltage and the second supply voltage. Additionally, the method includes processing information associated with the control signal, turning on or off a first transistor based on at least information associated with the control signal, and turning on or off a second transistor based on at least information associated with the control signal. The first transistor and the second transistor are coupled to an input/output pad. The first supply voltage can be equal to at least a first voltage level or a second voltage level, the second voltage level being higher than the first voltage level, and the second supply voltage can be equal to at least a third voltage level or a fourth voltage level, the fourth voltage level being higher than the third voltage level. The control signal is indicative of a first control state if the first supply voltage is equal to the second voltage level and the second supply voltage is equal to the third voltage level, and the control signal is indicative of a second control state if the first supply voltage is equal to the second voltage level and the second supply voltage is equal to the fourth voltage level. If the control signal is indicative of the first control state, turning off the first transistor and turning off the second transistor. For example, the method is performed by the systems 200 and 250.

The present invention has various advantages. Some embodiments of the present invention provide a power-on control signal, which can make the input/output pad at a high impedance state if the input/output voltage supply is powered on but the core voltage supply is not yet powered on. Certain embodiments of the present invention provide a power-on control signal, which allows the input/output pad to work properly if both the input/output voltage supply and the core voltage supply are powered on. For example, the input/output pad is at a logic high state, a logic low state, or a high impedance state. Some embodiments of the present invention can reduce or eliminate high input/output crowbar current even if the input/output voltage supply is powered on but the core voltage supply is not yet powered on. Certain embodiments of the present invention can reduce or eliminate bus congestion even if the input/output voltage supply is powered on but the core voltage supply is not yet powered on.

It is also understood that the examples and embodiments described herein are for illustrative purposes only and that various modifications or changes in light thereof will be suggested to persons skilled in the art and are to be included within the spirit and purview of this application and scope of the appended claims.

What is claimed is:

1. A system for controlling an input/output driver, the system comprising:
    a control system configured to receive a first supply voltage and a second supply voltage and generate a control signal;
    a first transistor including a first gate, a first terminal, and a second terminal, the first gate configured to receive the control signal, the first terminal configured to receive the first supply voltage;
    a second transistor including a second gate, a third terminal, and a fourth terminal, the second gate coupled to the second terminal;
    a third transistor including a third gate, a fifth terminal, and a sixth terminal, the third gate configured to receive the control signal;
    an input/output pad coupled to the fourth terminal and the fifth terminal;
    wherein:
        the first supply voltage can be equal to at least a first voltage level or a second voltage level, the second voltage level being higher than the first voltage level;
        the second supply voltage can be equal to at least a third voltage level or a fourth voltage level, the fourth voltage level being higher than the third voltage level;
        the control signal is indicative of a first control state if the first supply voltage is equal to the second voltage level and the second supply voltage is equal to the third voltage level;
        the control signal is indicative of a second control state if the first supply voltage is equal to the second voltage level and the second supply voltage is equal to the fourth voltage level;
        if the control signal is indicative of the first control state, the second transistor and the third transistor are turned off.

2. The system of claim 1, and further comprising:
    a fourth transistor including a fourth gate, a seventh terminal, and an eighth terminal, the seventh terminal configured to receive the first supply voltage, the eighth terminal being coupled to the third terminal;
    a fifth transistor including a fifth gate, a ninth terminal, and a tenth terminal, the ninth terminal being coupled to the sixth terminal, the tenth terminal configured to receive a predetermined voltage level.

3. The system of claim 2 wherein the predetermined voltage level is a ground voltage level.

4. The system of claim 2 wherein the input/output driver comprises the second transistor, the third transistor, the fourth transistor, and the fifth transistor.

5. The system of claim 1 wherein:
the first transistor includes a first PMOS transistor;
the second transistor includes a second PMOS transistor;
the third transistor includes an NMOS transistor.

6. The system of claim 1 wherein the first supply voltage is an input/output supply voltage.

7. The system of claim 1 wherein the second supply voltage is a core supply voltage.

8. The system of claim 1 wherein:
the control signal is associated with a fifth voltage level if the first supply voltage is equal to the second voltage level and the second supply voltage is equal to the third voltage level;
the control signal is associated with a sixth voltage level if the first supply voltage is equal to the second voltage level and the second supply voltage is equal to the fourth voltage level;
the fifth voltage level and the sixth voltage level are different.

9. The system of claim 1 wherein the second voltage level and the fourth voltage level are different.

10. A system for controlling an input/output driver, the system comprising:
a control system configured to receive a first supply voltage and a second supply voltage and generate a control signal;
a first transistor including a first gate, a first terminal, and a second terminal, the first gate configured to receive the control signal, the first terminal configured to receive the first supply voltage;
a second transistor including a second gate, a third terminal, and a fourth terminal, the second gate being coupled to the second terminal;
a third transistor including a third gate, a fifth terminal, and a sixth terminal, the third gate configured to receive the control signal;
an input/output pad coupled to the fourth terminal and the fifth terminal;
wherein the control system includes:
a fourth transistor including a fourth gate, the fourth gate configured to receive the second supply voltage;
an inverter configured to receive the second supply voltage and generate a voltage signal;
a fifth transistor including a fifth gate and a seventh terminal, the fifth gate configured to receive the voltage signal;
a sixth transistor including a sixth gate, coupled to the fourth transistor and the fifth transistor, and configured to receive the first supply voltage;
a seventh transistor including a seventh gate and an eighth terminal, coupled to the fourth transistor and the fifth transistor, and configured to receive the first supply voltage.

11. The system of claim 10 wherein:
the seventh terminal, the eighth terminal and the sixth gate are connected to each other at a node;
the control signal is generated at the node.

12. The system of claim 10 wherein:
the first supply voltage can be equal to at least a first voltage level or a second voltage level, the second voltage level being higher than the first voltage level;
the second supply voltage can be equal to at least a third voltage level or a fourth voltage level, the fourth voltage level being higher than the third voltage level;
the control signal is indicative of a first control state if the first supply voltage is equal to the second voltage level and the second supply voltage is equal to the third voltage level;
the control signal is indicative of a second control state if the first supply voltage is equal to the second voltage level and the second supply voltage is equal to the fourth voltage level;
if the control signal is indicative of the first control state, the second transistor and the third transistor are turned off.

13. The system of claim 10 wherein:
the fourth transistor includes a first NMOS transistor;
the fifth transistor includes a second NMOS transistor;
the sixth transistor includes a first PMOS transistor;
the seventh transistor includes a second PMOS transistor.

14. The system of claim 10 wherein the first supply voltage is an input/output supply voltage.

15. The system of claim 10 wherein the second supply voltage is a core supply voltage.

16. The system of claim 10 wherein:
the control signal is associated with a fifth voltage level if the first supply voltage is equal to the second voltage level and the second supply voltage is equal to the third voltage level;
the control signal is associated with a sixth voltage level if the first supply voltage is equal to the second voltage level and the second supply voltage is equal to the fourth voltage level;
the fifth voltage level and the sixth voltage level are different.

17. A method for controlling an input/output driver, the method comprising:
receiving a first supply voltage;
receiving a second supply voltage;
processing information associated with the first supply voltage and the second supply voltage;
generating a control signal based on at least information associated with the first supply voltage and the second supply voltage;
processing information associated with the control signal;
turning on or off a first transistor based on at least information associated with the control signal;
turning on or off a second transistor based on at least information associated with the control signal;
wherein:
the first transistor and the second transistor are coupled to an input/output pad;
the first supply voltage can be equal to at least a first voltage level or a second voltage level, the second voltage level being higher than the first voltage level;
the second supply voltage can be equal to at least a third voltage level or a fourth voltage level, the fourth voltage level being higher than the third voltage level;
the control signal is indicative of a first control state if the first supply voltage is equal to the second voltage level and the second supply voltage is equal to the third voltage level;
the control signal is indicative of a second control state if the first supply voltage is equal to the second voltage level and the second supply voltage is equal to the fourth voltage level;
if the control signal is indicative of the first control state, turning off the first transistor and turning off the second transistor.

18. The system of claim 17 wherein the first supply voltage is an input/output supply voltage.

19. The system of claim 17 wherein the second supply voltage is a core supply voltage.

20. The system of claim 17 wherein:

the control signal is associated with a fifth voltage level if the first supply voltage is equal to the second voltage level and the second supply voltage is equal to the third voltage level;

the control signal is associated with a sixth voltage level if the first supply voltage is equal to the second voltage level and the second supply voltage is equal to the fourth voltage level;

the fifth voltage level and the sixth voltage level are different.

* * * * *